(12) United States Patent
Minami et al.

(10) Patent No.: US 10,147,355 B2
(45) Date of Patent: *Dec. 4, 2018

(54) PIXEL CIRCUIT AND DISPLAY DEVICE

(71) Applicant: Sony Corporation, Tokyo (JP)

(72) Inventors: Tetsuo Minami, Tokyo (JP); Yukihito Iida, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/336,366

(22) Filed: Oct. 27, 2016

(65) Prior Publication Data

US 2017/0047014 A1 Feb. 16, 2017

Related U.S. Application Data

(60) Continuation of application No. 15/086,845, filed on Mar. 31, 2016, now Pat. No. 9,483,980, which is a
(Continued)

(30) Foreign Application Priority Data

Feb. 14, 2007 (JP) .................................. 2007-033509

(51) Int. Cl.
*G09G 3/32* (2016.01)
*H01L 27/32* (2006.01)
(Continued)

(52) U.S. Cl.
CPC .......... *G09G 3/3258* (2013.01); *G09G 3/3233* (2013.01); *H01L 23/53219* (2013.01);
(Continued)

(58) Field of Classification Search
CPC .. G09G 3/3233; G09G 3/3258; H01L 27/124; H01L 27/3262; H01L 2251/5392; H01L 27/3276; H01L 27/3279
See application file for complete search history.

(56) References Cited

U.S. PATENT DOCUMENTS

| 6,037,923 A | 3/2000 | Suzuki |
| 6,392,628 B1 | 5/2002 | Yamazaki et al. |

(Continued)

FOREIGN PATENT DOCUMENTS

| JP | 08-234683 A | 9/1996 |
| JP | 2000-259111 A | 9/2000 |

(Continued)

OTHER PUBLICATIONS

Korean Office Action dated Sep. 7, 2016 for corresponding Korean Application No. 10-2016-0059011.
(Continued)

*Primary Examiner* — Xuemei Zheng
(74) *Attorney, Agent, or Firm* — Michael Best & Friedrich LLP

(57) ABSTRACT

A pixel circuit includes a switching transistor whose conduction is controlled by a drive signal supplied to the control terminal, a drive wiring adapted to propagate the drive signal, and a data wiring adapted to propagate a data signal. A multi-layered wiring structure is used so that a second wiring layer is formed on a layer different from that on which a first wiring layer is formed.

12 Claims, 10 Drawing Sheets

Related U.S. Application Data continuation of application No. 14/556,508, filed on Dec. 1, 2014, now Pat. No. 9,324,738, which is a continuation of application No. 14/230,540, filed on Mar. 31, 2014, now Pat. No. 8,994,623, which is a continuation of application No. 13/137,707, filed on Sep. 6, 2011, now Pat. No. 8,730,134, which is a division of application No. 12/010,675, filed on Jan. 29, 2008, now Pat. No. 8,013,812.

(51) Int. Cl.
| | |
|---|---|
| G09G 3/3258 | (2016.01) |
| G09G 3/3233 | (2016.01) |
| H01L 27/12 | (2006.01) |
| H01L 29/786 | (2006.01) |
| H01L 23/532 | (2006.01) |

(52) U.S. Cl.
CPC ........ *H01L 27/124* (2013.01); *H01L 27/3262* (2013.01); *H01L 27/3265* (2013.01); *H01L 27/3276* (2013.01); *H01L 27/3279* (2013.01); *H01L 29/78672* (2013.01); *G09G 2300/0809* (2013.01); *G09G 2300/0819* (2013.01); *G09G 2300/0842* (2013.01); *G09G 2300/0861* (2013.01); *G09G 2320/0223* (2013.01); *G09G 2320/043* (2013.01); *H01L 2251/5392* (2013.01)

(56) References Cited

U.S. PATENT DOCUMENTS

| | | | |
|---|---|---|---|
| 6,919,681 B2 | 7/2005 | Cok et al. | |
| 7,230,593 B2 | 6/2007 | Nakanishi | |
| 7,646,363 B2 | 1/2010 | Yamashita et al. | |
| 7,751,600 B2 | 7/2010 | Yamazaki | |
| 8,730,134 B2 | 5/2014 | Minami et al. | |
| 8,994,623 B2 | 3/2015 | Minami et al. | |
| 2001/0022572 A1 | 9/2001 | Murade | |
| 2002/0074551 A1 | 6/2002 | Kimura | |
| 2004/0217694 A1 | 11/2004 | Cok et al. | |
| 2005/0030264 A1 | 2/2005 | Tsuge et al. | |
| 2005/0057580 A1 | 3/2005 | Yamano et al. | |
| 2005/0168491 A1 | 8/2005 | Takahara et al. | |
| 2005/0243038 A1 | 11/2005 | Kwak | |
| 2005/0255617 A1* | 11/2005 | Yamazaki | H01L 27/3244 438/22 |
| 2006/0001366 A1* | 1/2006 | Chung | H01L 27/3276 313/506 |
| 2006/0244699 A1* | 11/2006 | Yamazaki | G09G 3/3233 345/82 |
| 2006/0262048 A1 | 11/2006 | Yamada | |
| 2007/0115225 A1 | 5/2007 | Uchino et al. | |
| 2007/0284585 A1* | 12/2007 | Cho | H01L 27/3262 257/72 |
| 2009/0218931 A1 | 9/2009 | Shimodaira | |

FOREIGN PATENT DOCUMENTS

| | | |
|---|---|---|
| JP | 2000-356963 A | 12/2000 |
| JP | 2005-181422 A | 7/2005 |
| JP | 2006-018084 A | 1/2006 |
| KR | 2001-0085613 A | 9/2001 |
| KR | 2004-0094353 A | 11/2004 |
| KR | 10-2006-0125631 | 12/2006 |

OTHER PUBLICATIONS

Japanese Office Action dated Dec. 20, 2011 for corresponding Japanese Application No. 2007-033509.
Korean Office Action dated Mar. 31, 2014 for corresponding Korean Patent Application No. 10-2008-0007419.
Korean Office Action dated Oct. 31, 2014 for corresponding Korean Application No. 10-2008-7419.
Korean Office Action dated Mar. 27, 2015 for corresponding Korean Application No. 10-2014-65621.
Korean Office Action dated Sep. 17, 2015 for corresponding Korean Application No. 10-2015-0074193.
Korean Office Action dated Sep. 7, 201 for corresponding Korean Application No. 10-2016-0059008.
Korean Office Action dated Sep. 7, 2015 for corresponding Korean Application No. 10-2016-0059011.
Korean Office Action dated Oct. 17, 2018 for corresponding Korean Application No. 10-2018-0093170.

* cited by examiner

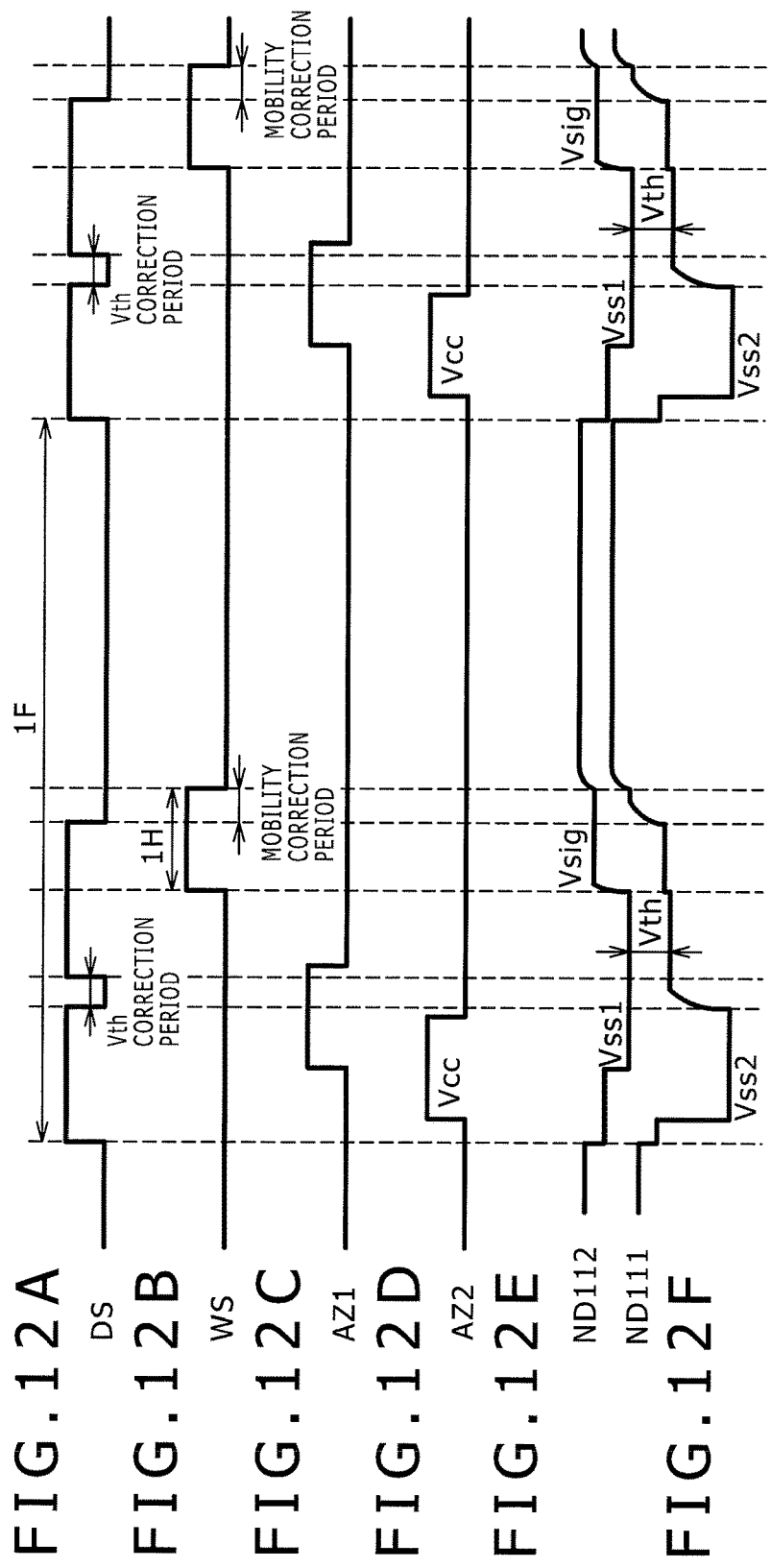

PIXEL CIRCUIT AND DISPLAY DEVICE

CROSS REFERENCES TO RELATED APPLICATIONS

This is a Continuation application of U.S. patent application Ser. No. 15/086,845, filed Mar. 31, 2016, which is a Continuation application of U.S. patent application Ser. No. 14/556,508, filed Dec. 1, 2014, now U.S. Pat. No. 9,324,738, issued Apr. 26, 2016, which is a Continuation application of U.S. patent application Ser. No. 14/230,540, filed Mar. 31, 2014, now U.S. Pat. No. 8,994,623, issued Mar. 31, 2015, which is a Continuation application of U.S. patent application Ser. No. 13/137,707, filed Sep. 6, 2011, now U.S. Pat. No. 8,730,134, issued May 20, 2014, which is a Divisional application of U.S. patent application Ser. No. 12/010,675, filed Jan. 29, 2008, now U.S. Pat. No. 8,013,812, issued Sep. 6, 2011, which in turn claims priority from Japanese Application No. 2007-033509, filed with the Japan Patent Office on Feb. 14, 2007, the entire contents of which being incorporated herein by reference.

BACKGROUND OF THE INVENTION

1. Field of the Invention

The present invention relates to a display device such as organic EL (Electro Luminescence) display having pixel circuits arranged in a matrix form, each of which has an electro-optical element whose brightness is controlled by a current. The invention relates particularly to a so-called active matrix display device in which the current flowing through an electro-optical element is controlled by an insulated gate field effect transistor disposed in each pixel circuit.

2. Description of the Related Art

An image display device such as liquid crystal displays an image by controlling the optical intensity of each pixel according to image information to be displayed. This is also true for organic EL and other displays. However, organic EL display is a so-called spontaneous luminescent display having a light-emitting element in each pixel circuit. This type of display offers advantages including high image visibility, no need for backlights and high response speed.

Further, organic EL display differ significantly from liquid crystal display and other types of display in that the brightness of each light-emitting element is controlled by a current flowing therethrough to provide color gradation. That is, the light-emitting elements are current-controlled.

As with liquid crystal displays, organic EL displays can be driven by simple or active matrix. It should be noted, however, that although the formers are simple in structure, they have disadvantages including difficulties in implementing a large-size, high-definition display. As a result, the development of active matrix displays has been going on at a brisk pace in recent years. In this type of display, the current flowing through the electro-optical element in each pixel circuit is controlled by an active element, which is generally a TFT (Thin Film Transistor), provided in the same pixel circuit.

FIG. 1 is a block diagram illustrating the configuration of a typical organic EL display device.

A display device 1 includes a pixel array section 2 having pixel circuits (PXLCs) 2a arranged in an m by n matrix. The display device 1 further includes a horizontal selector (HSEL) 3, write scanner (WSCN) 4, data wirings DTL1 to DTLn and scan lines WSL1 to WSLm. The data wirings DTL1 to DTLn are selected by the horizontal selector 3 and supplied with a data signal commensurate with brightness information. The scan lines WSL1 to WSLm are selectively driven by the write scanner 4.

It should be noted that the horizontal selector 3 and write scanner 4 may be formed on a polycrystalline silicon or around pixels using, for example, a MOSIC.

FIG. 2 is a circuit diagram illustrating a configuration example of the pixel circuit 2a in FIG. 1 (refer to, for example, U.S. Pat. No. 5,684,365 and Japanese Patent Laid-Open No. Hei 8-234683).

The pixel circuit 2a in FIG. 2, which is the simplest in configuration of a large number of circuits proposed, is a so-called dual-transistor drive circuit.

The pixel circuit 2a in FIG. 2 includes p-channel thin film field effect transistors (hereinafter referred to as "TFTs") 11 and 12, a capacitor C11, and an organic EL element (OLED) 13 which is a light-emitting element. In FIG. 2, DTL and WSL represent the data wiring and scan line, respectively.

An organic EL element has often rectifying capability. As a result, it is sometimes referred to as an OLED (Organic Light Emitting Diode). Although represented by a diode symbol in FIG. 2 and other drawings, the organic EL element is not necessarily demanded to offer rectifying capability in the description given below.

In FIG. 2, the TFT 11 has its source connected to a supply potential VCC. The light-emitting element 13 has its cathode connected to a ground potential GND. The pixel circuit 2a in FIG. 2 operates in the manner described below.

Step ST1:
The scan line WSL is placed into a selected state (pulled down to low level in this case). Then, a write potential Vdata is applied to the data wiring DTL. As a result, the TFT 12 conducts, charging or discharging the capacitor C11 and bringing the gate potential of the TFT 11 to Vdata.

Step ST2:
The scan line WSL is placed into an unselected state (pulled up to high level in this case). This causes the data wiring DTL and TFT 11 to be electrically isolated from each other. However, the gate potential of the TFT 11 is maintained constant by the capacitor C11.

Step ST3:
The current flowing through the TFT 11 and light-emitting element 13 takes on a value commensurate with a gate-to-source voltage Vgs of the TFT 11. As a result, the light-emitting element 13 continues to emit light at the brightness commensurate with the current.

The operation adapted to select the scan line WSL and convey the brightness information, which has been given to the data wiring, to the pixel circuit is hereinafter referred to as "writing."

As described above, the light-emitting element 13 in the pixel circuit 2a shown in FIG. 2 continues to emit light at a constant brightness once the potential Vdata is written. The light-emitting element 13 continues to do so until the potential Vdata is rewritten.

As described above, the pixel circuit 2a controls the current value flowing through the light-emitting element 13 by changing the voltage applied to the gate of the TFT 11 which serves as a drive transistor.

At this time, the p-channel drive transistor has its source connected to the supply potential VCC. As a result, this TFT 11 operates in the saturated region at all times. Therefore, the TFT 11 serves as a constant current source whose current has the value shown in Equation 1 below.

(Equation 1)

$$Ids = \frac{1}{2} * \mu (W/L) Cox (Vgs - |Vth|)^2 \qquad (1)$$

Here, μ is the carrier mobility, Cox the gate capacitance per unit area, W the gate width, L the gate length, Vgs the gate-to-source voltage of the TFT 11, and Vth the threshold of the TFT 11.

With a simple matrix image display device, each light-emitting element emits light only instantaneously when selected. In contrast, with an active matrix display device, the light-emitting elements continue to emit light even after the writing is complete, as described above. As a result, an active matrix display device can provide high peak brightness and reduced peak current as compared to a simple matrix display device, making this type of display device advantageous particularly when it is used in a large-size, high-definition display.

FIG. 3 is a view illustrating the secular change of the current vs. voltage (I-V) characteristic of the organic EL element. In FIG. 3, the curve shown by a solid line represents the characteristic in the initial state, whereas the curve shown by a dashed line represents the characteristic following a secular change.

The I-V characteristic of the organic EL element generally deteriorates over time as illustrated in FIG. 3.

However, the dual-transistor drive circuit shown in FIG. 2 is driven by a constant current. As a result, a constant current continues to flow through the organic EL element. This keeps the organic EL element free from secular deterioration of emission brightness even in the event of a deterioration of the I-V characteristic thereof.

Incidentally, the pixel circuit 2a in FIG. 2 includes p-channel TFTs. However, if the same circuit 2a includes n-channel TFTs, the existing amorphous silicon (a-Si) process can be used to manufacture TFTs. This provides reduced costs for TFT substrates.

Next, a basic pixel circuit will be described in which p-channel TFTs are replaced by n-channel TFTs.

FIG. 4 is a circuit diagram illustrating a pixel circuit which includes n-channel TFTs in place of p-channel TFTs shown in FIG. 2.

A pixel circuit 2b shown in FIG. 4 includes n-channel TFTs 21 and 22, a capacitor C21, and an organic EL element (OLED) 23 which is a light-emitting element. In FIG. 4, DTL and WSL represent the data wiring and scan line, respectively.

In the pixel circuit 2b, the TFT 21 serves as a drive transistor. The TFT 21 has its drain connected to the supply potential VCC and its source connected to the anode of the EL element 23, thus forming a source follower circuit.

FIG. 5 is a view illustrating an operating point of the TFT 21, which serves as a drive transistor, and the EL element 23 in the initial state. In FIG. 5, a drain-to-source voltage Vds of the TFT 21 is plotted along the horizontal axis, and a drain-to-source current Ids thereof along the vertical axis.

As illustrated in FIG. 5, the source voltage is determined by the operating point of the TFT 21, which serves as a drive transistor, and the EL element 23. This voltage varies depending on the gate voltage.

The TFT 21 is driven in the saturated region. As a result, the current Ids shown in Equation 1 flows through the TFT 21. The current Ids is related to Vgs which is associated with the source voltage at the operating point.

SUMMARY OF THE INVENTION

The pixel circuit described above is the simplest of all circuits. Practically, however, the circuit contains additional components such as a TFT connected in series with the organic EL element to serve a drive transistor and other TFTs adapted to cancel the mobility and threshold.

For these TFTs, a gate pulse is generated by vertical scanners provided on both or one side of the active matrix organic EL display panel. This pulse signal is transmitted through wirings and applied to a desired TFT in the pixel circuits arranged in a matrix form.

If this pulse signal is applied to two or more TFTs, the timings at which the signal is applied are important.

As illustrated in FIG. 6, however, a drive wiring which applies the pulse signal to the gate of the transistor (TFT) in the pixel circuit 2a via a buffer 40 is generally made of Mo (molybdenum). A wiring resistance r gives rise to a pulse delay and transient changes. This leads to a time lag, causing shading and banding. The greater the distance from the scanner, the larger the resistance of the wiring leading to the transistor gate in the pixel circuit 2a.

This leads to a difference in mobility correction period, for example, between the two ends of the panel, resulting in a brightness difference.

Further, because of a deviation of the mobility correction period from the optimal one, the mobility correction fails to correct the variation of the mobility of some pixels, thus resulting in stripes viewable on the screen.

There is a need for the present invention to provide a pixel circuit and display device using the same capable of suppressing shading and banding resulting from the resistance of a wiring through which a gate pulse is supplied.

A pixel circuit according to a first embodiment of the present invention includes at least one switching transistor whose conduction is controlled by a drive signal supplied to the control terminal, a drive wiring adapted to propagate the drive signal, and a data wiring adapted to propagate a data signal. The drive wiring is formed on a first wiring layer and connected to the control terminal of the switching transistor. The data wiring is formed on a second wiring layer and connected to a first terminal of the switching transistor. A multi-layered wiring structure is used so that the second wiring layer is formed on a layer different from that on which the first wiring layer is formed.

Preferably, the drive wiring layer is formed with the same material as the data wiring layer.

Preferably, the drive wiring layer is formed with Al, aluminum.

A display device according to a second embodiment of the present invention includes a plurality of pixel circuits arranged in a matrix form. Each of the plurality of pixel circuits includes at least one switching transistor whose conduction is controlled by a drive signal supplied to the control terminal, a drive wiring adapted to propagate the drive signal, a data wiring adapted to propagate a data signal, and an electro-optical element whose brightness changes with change in current flowing. The display device further includes a first scanner adapted to output the drive signal onto the drive wiring and a second scanner adapted to output the data signal onto the data wiring. The drive wiring is formed on a first wiring layer. The drive wiring is connected to the control terminal of the switching transistor and the first scanner. The data wiring layer is formed on a second wiring layer. The data wiring layer is connected to a first terminal of the switching transistor and the second scanner. A multi-layered wiring structure is used so that the second wiring layer is formed on a layer different from that on which the first wiring layer is formed.

Preferably, the drive wiring layer is formed with the same material as the data wiring layer.

Preferably, the drive wiring layer is formed with Al, aluminum.

According to the present embodiment, a pixel circuit includes at least one switching transistor, drive wiring and data wiring. The pixel circuit has a multi-layered wiring structure so that the drive wiring is formed on a first wiring layer, and the data wiring on a second wiring layer.

The present embodiment can suppress shading and banding resulting from the resistance of a wiring through which a gate pulse is supplied.

BRIEF DESCRIPTION OF THE DRAWINGS

FIGS. 12A to 12F are timing diagrams for describing the operation of the present embodiment.

DETAILED DESCRIPTION OF THE PREFERRED EMBODIMENT

An embodiment of the present invention will be described below with reference to the accompanying drawings.

Figure 1:
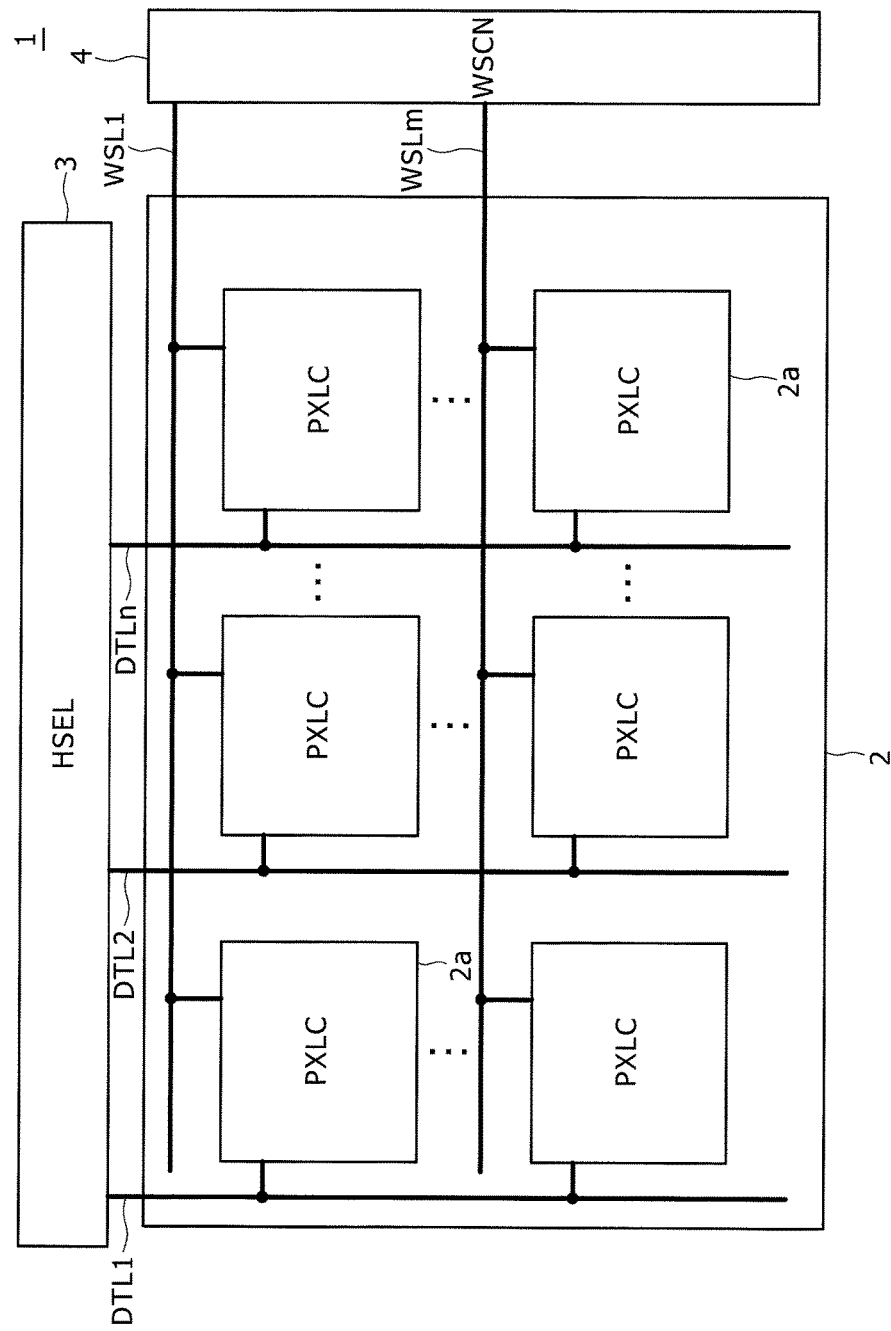
FIG. 1 is a block diagram illustrating the configuration of a typical organic EL display device.
Figure 2:
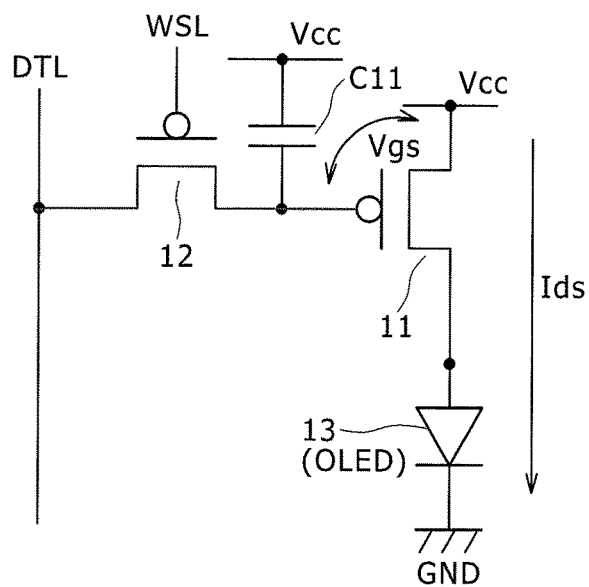
FIG. 2 is a circuit diagram illustrating a configuration example of a pixel circuit shown in FIG. 1.
Figure 3:
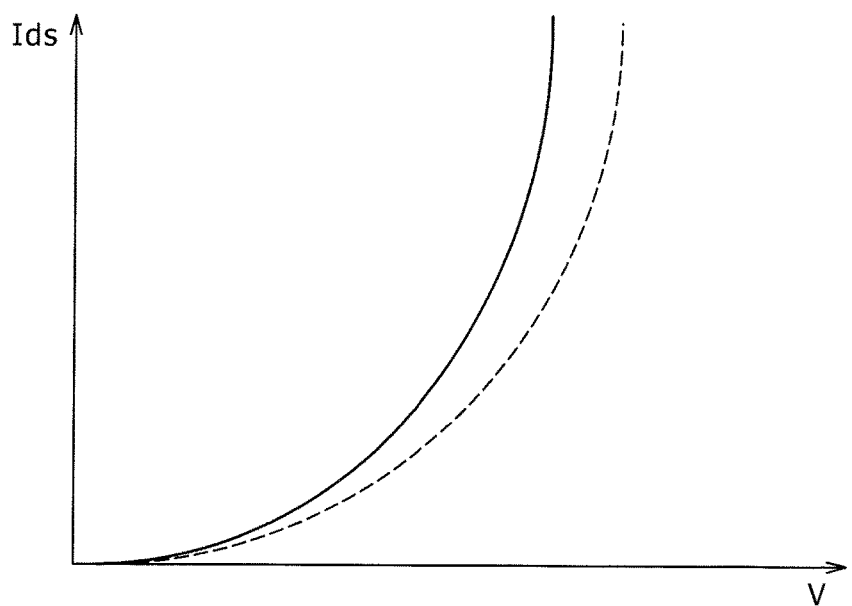
FIG. 3 is a view illustrating the secular change of the current vs. voltage (I-V) characteristic of an organic EL element.
Figure 4:
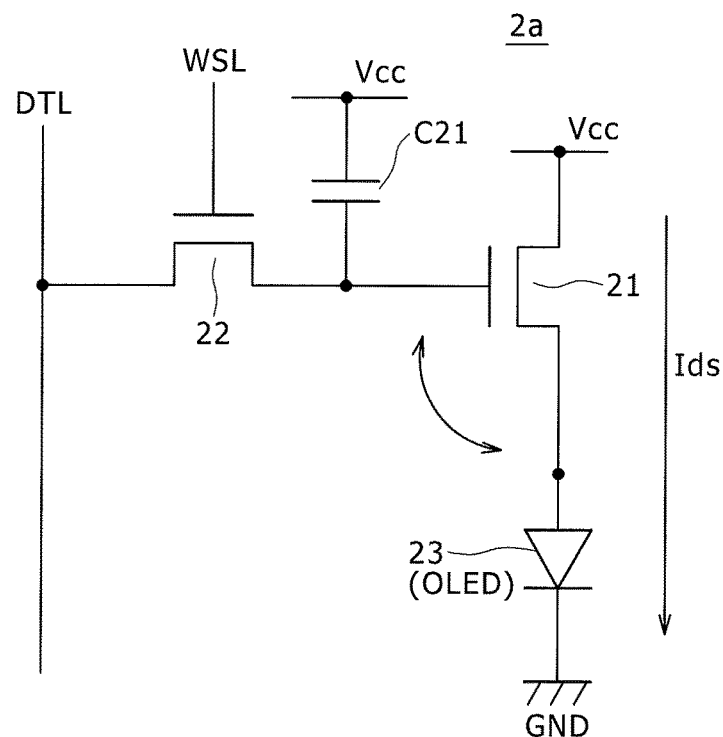
FIG. 4 is a circuit diagram illustrating a pixel circuit which includes n-channel TFTs in place of p-channel TFTs shown in FIG. 2.
Figure 5:
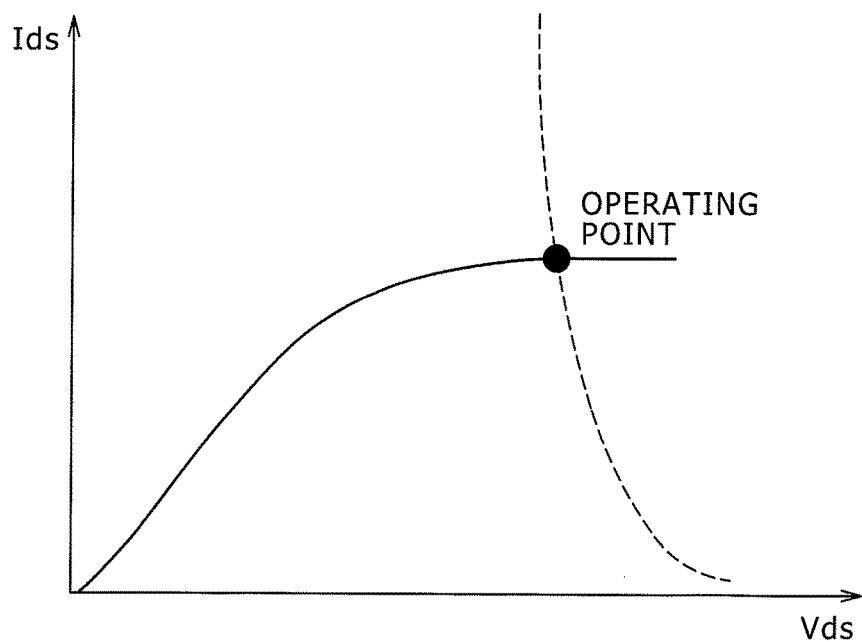
FIG. 5 is a view illustrating an operating point of the TFT 21, which serves as a drive transistor, and the EL element 23 in the initial state.
Figure 6:
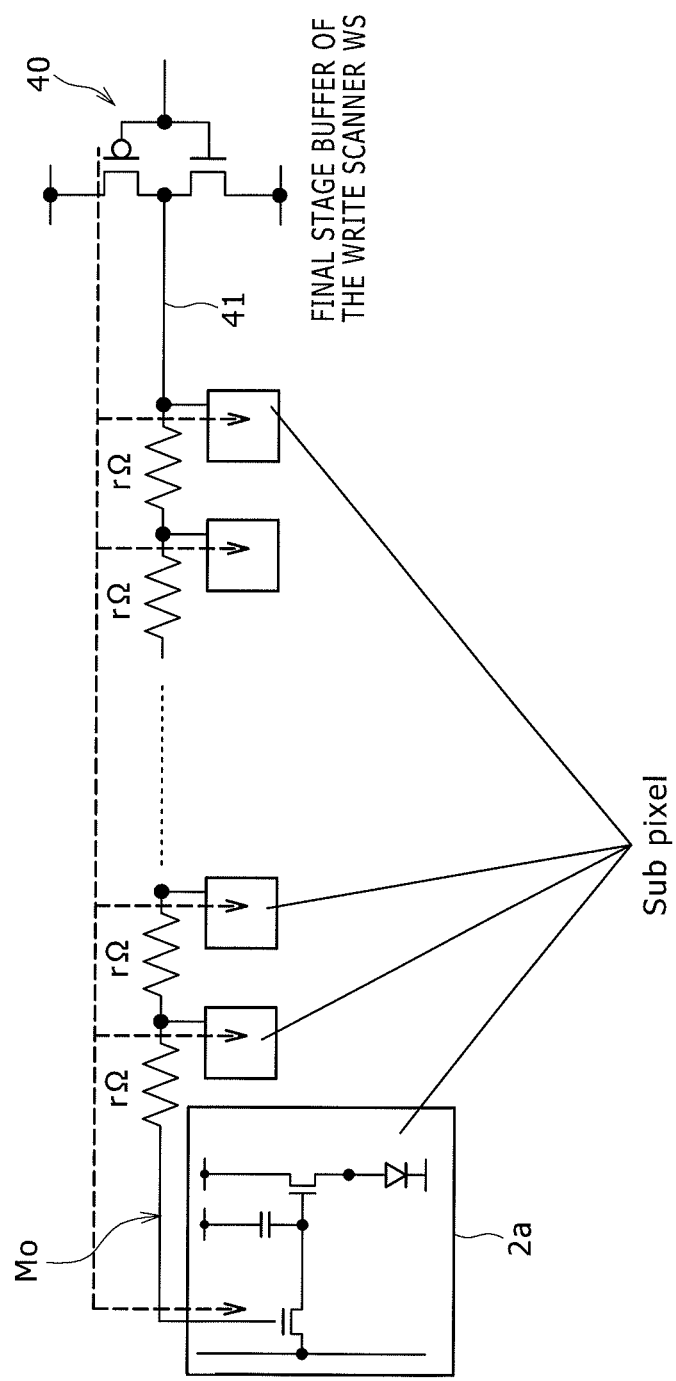
FIG. 6 is a view for describing disadvantages caused by wiring resistance.
Figure 7:
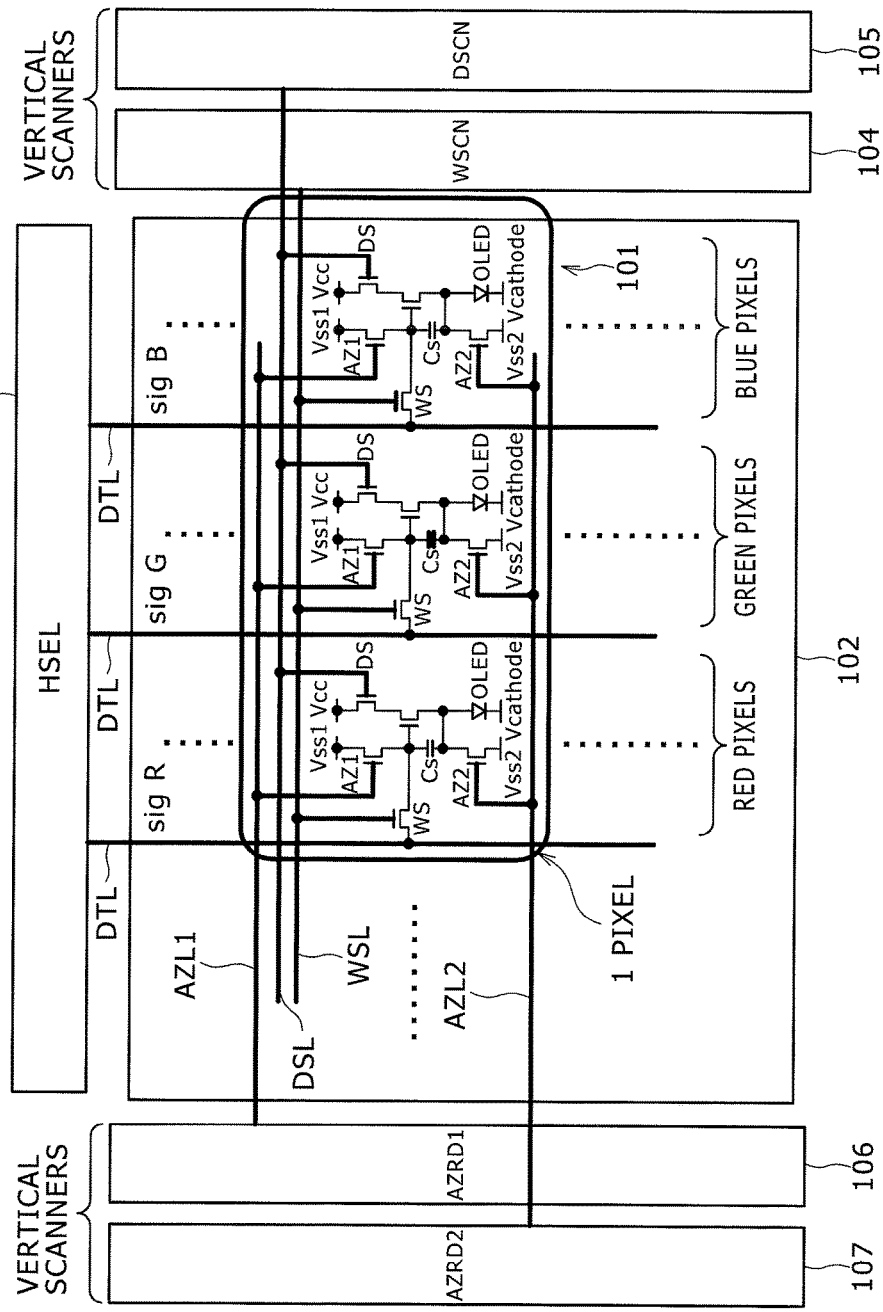
FIG. 7 is a block diagram illustrating the configuration of an organic EL display device using pixel circuits according to an embodiment of the present invention.

FIG. 7 is a block diagram illustrating the configuration of an organic EL display device using pixel circuits according to an embodiment of the present invention.

Figure 8:
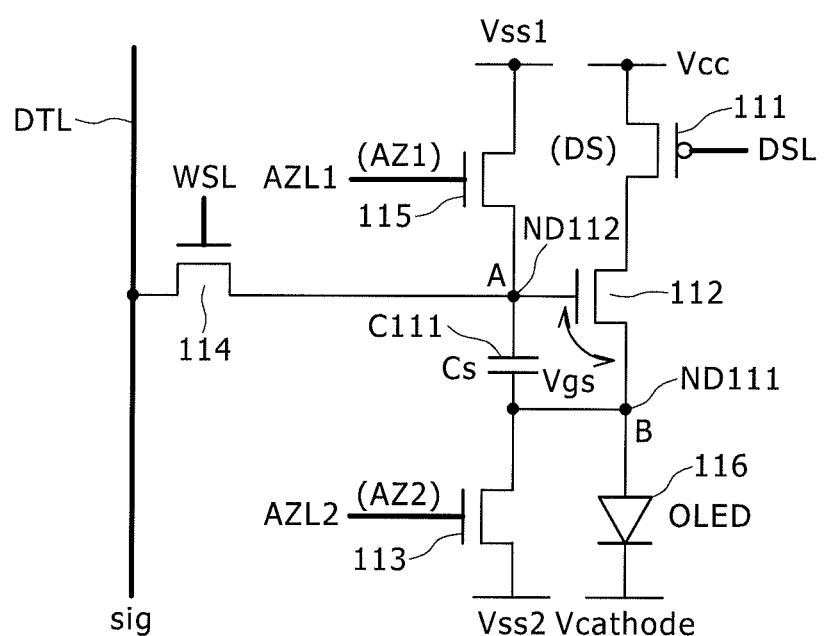
FIG. 8 is a circuit diagram illustrating the concrete configuration of the pixel circuit according to the present embodiment.

FIG. 8 is a circuit diagram illustrating the concrete configuration of the pixel circuit according to the present embodiment.

A display device 100 includes a pixel array section 102 having pixel circuits 101 arranged in an m by n matrix. The display device 100 further includes a horizontal selector (HSEL) 103, write scanner (WSCN) 104, drive scanner (DSCN) 105, and first and second auto-zero circuits (AZRD1) 106 and (AZRD2) 107. The display device 100 still further includes data wirings DTL, scan line WSL and drive line DSL. The data wirings DTL are selected by the horizontal selector 103 and supplied with a data signal commensurate with brightness information. The scan line WSL is selected and driven by the write scanner 104 and serves as a first drive wiring. The drive line DSL is selected and driven by the drive scanner 105 and serves as a second drive wiring. The display device 100 still further includes first and second auto-zero lines AZL1 and AZL2. The first and second auto-zero lines AZL1 and AZL2 are selected and driven respectively by the first and second auto-zero circuits (AZRD1) 106 and 107.

The pixel circuit 101 according to the present embodiment includes a p-channel TFT 111, n-channel TFTs 112 to 115, a capacitor C111, light-emitting element 116 which includes an organic EL element (OLED: electro-optical element), and first and second nodes ND111 and ND112.

A first switching transistor is formed by the TFT 114, second switching transistor by the TFT 113, third switching transistor by the TFT 115, and fourth switching transistor by the TFT 111.

It should be noted that the supply line of the supply voltage VCC (supply potential) corresponds to a first reference potential, and the ground potential GND to a second reference potential. Further, VSS1 corresponds to a fourth reference potential, and VSS2 to a third reference potential.

In the pixel circuit 101, the TFT 111, TFT 112 serving as a drive transistor, first node ND111 and light emitting element (OLED) 116 are connected in series between the first reference potential (supply potential VCC in the present embodiment) and the second reference potential (ground potential GND in the present embodiment). More specifically, the light emitting element 116 has its cathode connected to the ground potential GND and its anode connected to the first node ND111. The TFT 112 has its source connected to the first node ND111. The TFT 111 has its drain connected to the drain of the TFT 112 and its source connected to the supply potential VCC.

The TFT 112 has its gate connected to the second node ND 112. The TFT 111 has its gate connected to the drive line DSL.

The TFT 113 has its drain connected to the first node 111 and the first electrode of the C111. The TFT 113 has its source connected to a fixed potential VSS2 and its gate connected to the second auto-zero line AZL2. The capacitor C111 has its second electrode connected to the second node ND112.

The TFT 114 has its source and drain connected between the data wiring DTL and second node ND112. The TFT 114 has its gate connected to the scan line WSL.

Further, the TFT 115 has its source and drain connected between the second node ND112 and predetermined potential Vss1. The TFT 115 has its gate connected to the first auto-zero line AZL1.

As described above, in the pixel circuit 101 according to the present embodiment, the capacitor C111 is connected as a pixel capacitance between the gate and source of the TFT 112 serving as a drive transistor. The source potential of the TFT 112 is connected to the fixed potential via the TFT 113 serving as a switching transistor during a non-emission period. Further, the gate and drain of the TFT 112 are connected together, thus allowing for correction of the threshold Vth.

In the display device 100 according to the present embodiment, a material having a resistance lower than that of molybdenum is used for the gate wiring leading from the final stage (output stage) of the vertical scanner to the gate of the TFT (transistor) in the pixel circuit 101. Molybdenum is typically used for this purpose. This prevents shading and banding caused by a pulse delay resulting from the resistance of the wiring through which a drive pulse is supplied to the TFT gate in the pixel circuit 101.

This remedy against shading and banding is applied at least to the scan line WSL among the wirings, namely, the scan line WSL, drive line DSL and first and second auto-zero lines AZL1 and AZL2.

A first example of remedy will be described below. In this description, a case will be shown in which the remedy is applied to the scan line WSL.

Figure 9:
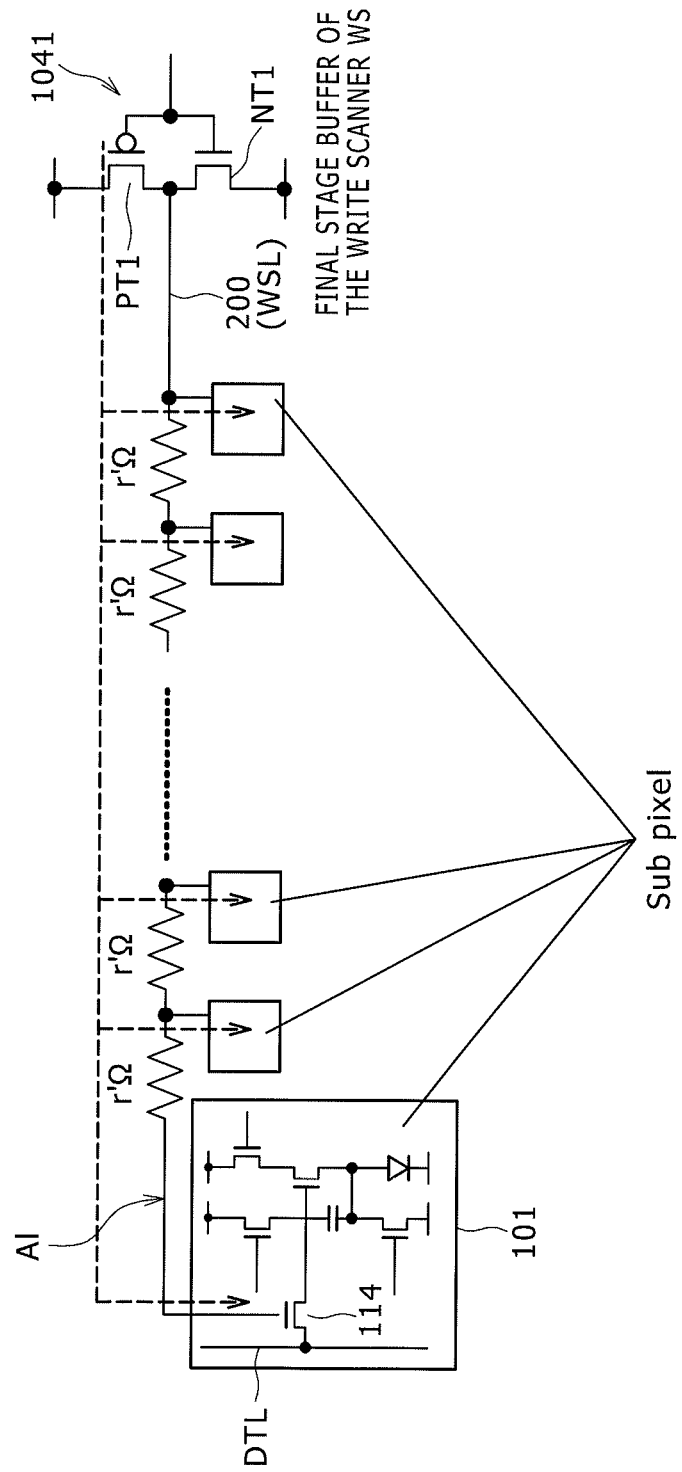
FIG. 9 is a view for describing a first example of remedy against shading and banding.

FIG. 9 is a view for describing an example of remedy against shading and banding.

In FIG. 9, 1041 denotes a final stage (output stage) buffer of the write scanner 104. This buffer is formed as a CMOS buffer for PMOS and NMOS transistors PT1 and NT1. On the other hand, the gate of the TFT 114 serving as a switching transistor of the pixel circuit 101 is connected to the final stage of the write scanner 104. A drive wiring 200 of the scan line WSL has a resistance r'.

In the present example, aluminum is used for the scan line WSL (drive wiring 200) and data wiring DTL. The wiring resistance r' of the scan line WSL made of aluminum is lower than the resistance r of the same line WSL made of molybdenum. The resistance r' is about one tenth the resistance r.

As described above, aluminum is used for both the scan line WSL and data wiring DTL in the present example of remedy, thus suppressing pulse signal delay and transient changes.

Incidentally, molybdenum is typically used for the scan line WSL, and aluminum for the data wiring DTL. These wirings and the pixel circuit 101 are laid out on a semiconductor substrate. However, using the same material, namely, aluminum, for the scan line WSL and data wiring DTL as in the present example results in a short circuit at an intersecting point of the scan line WSL and data wiring DTL.

This short circuit in the wirings will be described with reference to FIGS. 10A and 10B.

Figure 10A:
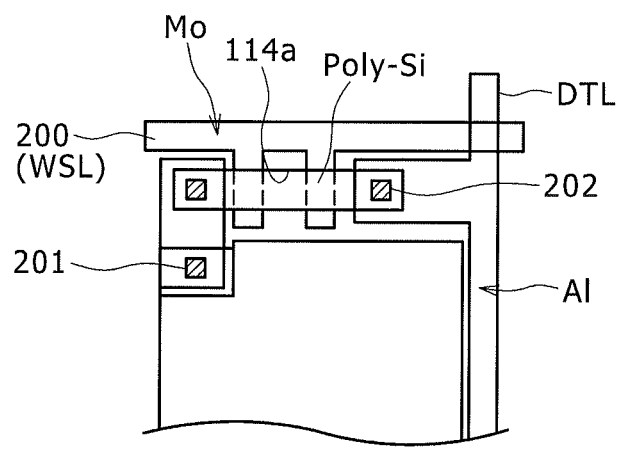
FIGS. 10A and 10B are views for describing a short circuit caused by a wiring pattern.
Figure 10B:
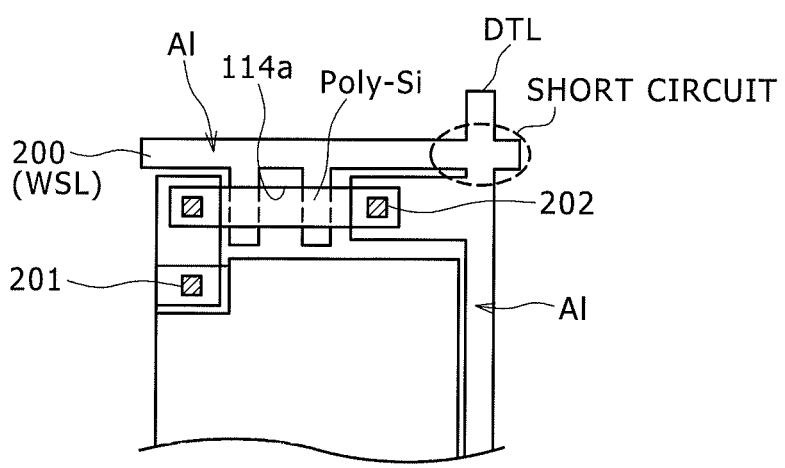

FIGS. 10A and 10B are views for describing a short circuit caused by a wiring pattern.

FIG. 10A illustrates the structure around a gate section 114a of the TFT 114 (refer to FIG. 9) when molybdenum is used for the scan line WSL (drive wiring 200), and aluminum for the data wiring DTL. On the other hand, FIG. 10B illustrates the structure around the gate section 114a of the TFT 114 when aluminum is used for both the scan line WSL and data wiring DTL. In FIGS. 10A and 10B, 201 denotes an Al/Mo (aluminum/molybdenum) contact, and 202 an Al/Poly (aluminum/polysilicon) contact.

As illustrated in FIG. 10A, the scan line WSL is formed with molybdenum, and the data wiring DTL with aluminum. As a result, no short circuit occurs at an intersecting point of the scan line WSL and data wiring DTL. However, if both the scan line WSL and data wiring DTL are formed with aluminum as illustrated in FIG. 10B, a short circuit occurs at an intersecting point of the two.

To avoid a short circuit at an intersecting point of the scan line WSL and data wiring DTL, the present example employs a multi-layered wiring structure for the scan line WSL and data wiring DTL.

This multi-layered wiring structure will be described with reference to FIG. 11.

Figure 11:
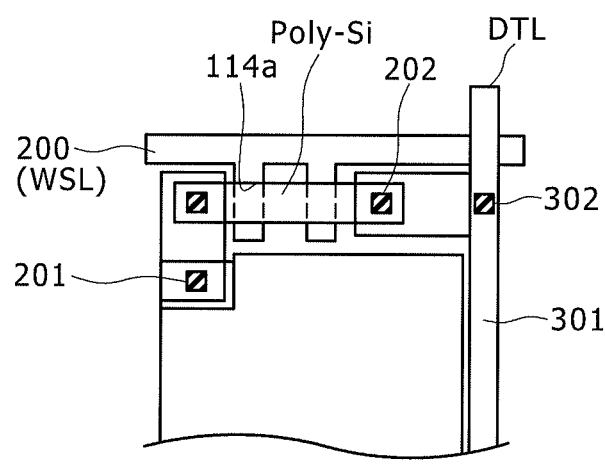
FIG. 11 is a view illustrating a configuration example using a multi-layered wiring structure.

FIG. 11 is a view illustrating a configuration example using a multi-layered wiring structure.

As illustrated in FIG. 11, the data wiring DTL is brought up to a new layer 301 using a material such as TiAl. As a result, in this configuration, the new layer 301 is provided on the second wiring layer which is higher in level than the first wiring layer on which the scan line WSL (drive wiring 200) is provided. Further, an Al/Al (new layer) contact 302 is provided on the new layer 301 in this configuration. The new layer 301 is connected to the first terminal of the TFT 114 via the contact 302. Still further, the scan line WSL is connected to the gate section 114a of the TFT 114 in this configuration. In the present example of remedy, the data wiring DTL transmits data signals using the new layer 301, and the drive wiring transmits drive signals.

It should be noted that both the scan line WSL and new layer 301 are made of the same material, namely, aluminum. In this case, the typical TFT process can be used.

As described above, a multi-layered wiring structure makes it possible to avoid a short circuit resulting from crossing of the wirings even when the scan line WSL and data wiring DTL are both made of aluminum.

The operation of the above configuration will be described next with reference to FIGS. 12A to 12F with emphasis on the operation of the pixel circuit.

FIG. 12A illustrates a drive signal DS applied to the drive line DSL, FIG. 12B a drive signal WS applied to the scan line WSL, FIG. 12C a drive signal AZ1 applied to the first auto-zero line AZL1, FIG. 12D a drive signal AZ2 applied to the second auto-zero line AZL2, FIG. 12E the potential of the second node ND 112, and FIG. 12F the potential of the first node ND 111.

The drive signal applied to the drive line DSL by the drive scanner 105 is maintained at high level. The drive signal WS applied to the scan line WSL by the write scanner 104 is maintained at low level. The drive signal AZ1 applied to the first auto-zero line AZL1 by the first auto-zero circuit 106 is maintained at low level. The drive signal AZ2 applied to the second auto-zero line AZL2 by the second auto-zero circuit 107 is maintained at high level.

As a result, the TFT 113 turns on, causing a current to flow through the TFT 113. This brings a source potential Vs of the TFT 112 (potential of the node ND 111) down to VSS2. As a result, the voltage applied to the light-emitting element 116 becomes zero, causing the same element 116 to stop emitting light.

In this case, even if the TFT 114 turns on, the voltage held by the capacitor C111, namely, the gate voltage of the TFT 112, remains unchanged.

Next, during a non-emission period of the EL light-emitting element 116, the drive signal AZ1 applied to the first auto-zero line AZL1 is pulled up to high level while the drive signal AZ2 applied to the second auto-zero line AZL2 is maintained at high level. This brings the potential of the second node ND 112 down to VSS1.

Then, after the drive signal AZ2 applied to the second auto-zero line AZL2 is switched back to low level, the drive signal DS applied to the drive line DSL by the drive scanner 105 is switched back to low level only for a predetermined period of time.

This causes the TFT 113 to turn off and the TFTs 115 and 112 to turn on. As a result, a current flows through the TFTs 112 and 111, raising the potential of the first node ND 111.

Then, the drive signal DS applied to the drive line DSL by the drive scanner 105 is switched to high level, and the drive signal AZ1 to low level.

As a result, the threshold Vth of the drive transistor TFT 112 is corrected, bringing the potential difference between the second and first nodes ND 112 and ND 111 to Vth.

This condition is maintained for a predetermined period of time, after which the drive signal WS applied to the scan line WSL by the write scanner 104 is maintained at high level. Data is written to the node ND 112 from the data wiring DTL. While the drive signal WS is at high level, the drive signal DS applied to the drive line DSL by the drive scanner 105 is switched to low level. Then, the drive signal WS is switched to low level after a while.

At this time, the TFT 112 turns on, and the TFT 114 turns off, allowing the mobility to be corrected.

In this case, the TFT 114 is off. The gate-to-source voltage of the TFT 112 is constant. As a result, the constant current Ids flows from the TFT 112 into the EL light emitting element 116. This raises the potential of the first node ND 111 to a voltage Vx where the current Ids flows through the EL light emitting element 116, causing the same element 116 to emit light.

Also in the present circuit, the current vs. voltage (I-V) characteristic of the EL element changes if the light emission time thereof is long. This causes the potential of the first node ND 111 to change as well. However, the gate-to-source voltage Vgs of the TFT 112 is maintained constant. As a result, the current flowing through the EL light emitting element 116 remains unchanged. Hence, even if the I-V characteristic of the same element 116 deteriorates, the constant current Ids continues to flow. As a result, the brightness of the same element 116 remains unchanged.

When the pixel circuit has a multi-layered wiring structure in which the scan line (drive wiring) and data wiring (new layer) are formed with aluminum as in the present example of remedy, the remedy is applied to the entire panel to prevent shading and banding resulting from a drive signal (pulse) delay due to wiring resistance. This ensures high quality image with minimal shading and banding.

A second example of remedy will be described next. In the present example, a multi-layered wiring structure is used as in the first example. The scan line WSL (drive wiring 200) is formed with Ag (silver), and the data wiring DTL with aluminum.

A wiring resistance r" of the scan line WSL made of silver is lower than the resistance r of the same line WSL made of molybdenum. This suppresses pulse signal delay and transient changes, thus providing the same effect as with the first example of remedy.

Further, the present embodiment provides the same effect as in the first and second examples of remedy when a multi-layered wiring structure is used as in the first and second examples and when a material lower in resistance than aluminum is used for the new layer 301. For example, silver is used for the new layer 301.

This ensures reduced impact of wiring resistance on the signal propagation, thus providing high quality image with minimal shading and banding.

It should be understood by those skilled in the art that various modifications, combinations, sub-combinations and alterations may occur depending on design requirements and other factors insofar as they are within the scope of the appended claims or the equivalents thereof.

What is claimed is:

1. A display device having a multi-layer wiring structure, comprising:
    a plurality of pixel circuits arranged in a display area;
    a first wiring extending through the display area and configured to propagate a control voltage; and
    a second wiring extending through the display area and configured to propagate a predetermined voltage,
    wherein at least one of the plurality of pixel circuits includes:
        an electro-optical element;
        a switching transistor including a control terminal, a channel portion and a first current terminal, the control terminal electrically connected to the first wiring, and the first current terminal electrically connected to the second wiring;
        a capacitive element including a first electrode and a second electrode, the first electrode electrically connected to the second terminal of the switching transistor;
    wherein the first wiring is a portion of a first layer, the second wiring is a portion of a second layer which is different from the first layer, and a first intermediate wiring is a portion of a third layer which is different from the second layer and a fourth layer, the channel portion and the first current terminal being portions of the fourth layer, the first intermediate wiring being electrically connected between the first current terminal and the second wiring,
    wherein the third layer is a layer above the fourth layer and the second layer is a layer above the third layer, and
    wherein the control terminal includes a plurality of gate electrodes each of which is a portion of the first wiring.

2. The display device according to claim 1, wherein the first wiring and the second wiring include a same material.

3. The display device according to claim 2, wherein the first wiring and the second wiring include aluminum.

4. The display device according to claim 1, wherein the second wiring includes silver and the first intermediate wiring includes aluminum.

5. The display device according to claim 1, wherein the channel portion includes a poly-silicon.

6. The display device according to claim 1, wherein at least one of the plurality of gate electrodes is a protruding portion of the first wiring.

7. The display device according to claim 1, wherein an electrical path from the second wiring to the capacitive element is formed using an aluminum-molybdenum contact and an aluminum-semiconductor contact.

8. The display device according to claim 1, wherein each of the plurality of pixel circuits includes a plurality of transistors respectively controlled by wiring lines;
    wherein the wiring lines include a scan line for controlling a sampling operation of an image voltage data which propagates through a signal line.

9. The display device according to claim 8, wherein the scan lane is part of the first wiring.

10. The display device according to claim 8, wherein the signal line is part of the second wiring, the predetermined voltage corresponds to the image voltage data, and the electro-optical element is configured to emit light in response to a value of the image voltage data.

11. The display device according to claim 1, wherein at least one of the plurality of pixel circuits further includes a driving transistor coupled to the capacitive element and configured to provide a driving current to the electro-optical element.

12. The display device according to claim 1, wherein the first wiring includes a lower resistance material than molybdenum, decreasing a propagation delay of the control voltage to avoid at least one of shading or banding.

* * * * *